United States Patent [19]

Ruile et al.

[11] Patent Number: 5,379,010

[45] Date of Patent: Jan. 3, 1995

[54] SURFACE ACOUSTIC WAVE REFLECTOR FILTER HAVING TWO NON-RESONANT TRACKS

[75] Inventors: Werner Ruile; Jüurgen Machui, both of München, Germany; Giuliano Visintini, Unterhaching, Italy

[73] Assignee: Siemens Aktiengesellschaft, Munich, Germany

[21] Appl. No.: 861,968

[22] PCT Filed: Dec. 14, 1990

[86] PCT No.: PCT/EP90/02193

§ 371 Date: Jun. 22, 1992

§ 102(e) Date: Jun. 22, 1992

[87] PCT Pub. No.: WO91/09465

PCT Pub. Date: Jun. 27, 1991

[30] Foreign Application Priority Data

Dec. 20, 1989 [DE] Germany ............... 3942140

[51] Int. Cl.⁶ .................................. H03H 9/64
[52] U.S. Cl. ...................... 333/195; 310/313 B; 310/313 D
[58] Field of Search ............... 333/193-195, 333/150, 153-155; 310/313 R, 313 B, 313 C, 313 D

[56] References Cited

U.S. PATENT DOCUMENTS

| | | | |
|---|---|---|---|
| 4,375,624 | 3/1983 | De Vries | 333/195 X |
| 4,609,891 | 9/1986 | Solie et al. | 333/195 |
| 5,093,638 | 3/1992 | Kinsman et al. | 333/195 |

OTHER PUBLICATIONS

Patent Abstracts of Japan, Band 10, Nr. 363, (E-461) (2420), 5. Dec. 1986 & JP, A, 61158207 (Toshiba), 17. Jul. 1986 "Surface Acoustic Wave Device".
Proceedings of the Institute of Electrical and Electronic Engineers, Band 63, Nr. 6, Jun. 1975, (New York, US) S. Pookaiyaudom et al.: "Electronmagnetic Leakage Suppression by Interdigital Transducers".

*Primary Examiner*—Benny Lee
*Attorney, Agent, or Firm*—Hill, Steadman & Simpson

[57] ABSTRACT

A surface wave reflection filter includes an input transducer, an output transducer, and a reflector in a first propagation track. To compensate for undesired surface waves proceeding directly between the input and output transducers, as opposed to the desired surface waves which are reflected before reaching the output transducer, a second propagation track is provided. The second track includes a input transducer and an output transducer, and is either connected in phase opposition to compensate for the undesired signal, or is constructed to generate a signal in phase opposition. A sump may be provided in the second track, a second reflector may be provided in the first track or in the second track, and the two tracks may be on separate or the same substrates.

8 Claims, 2 Drawing Sheets

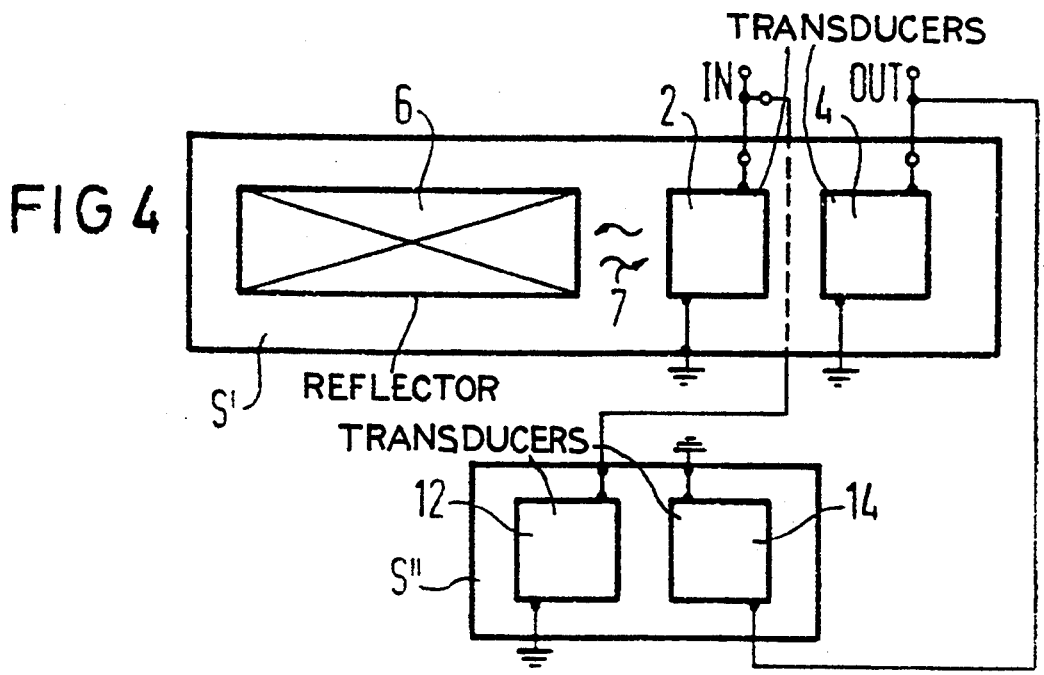
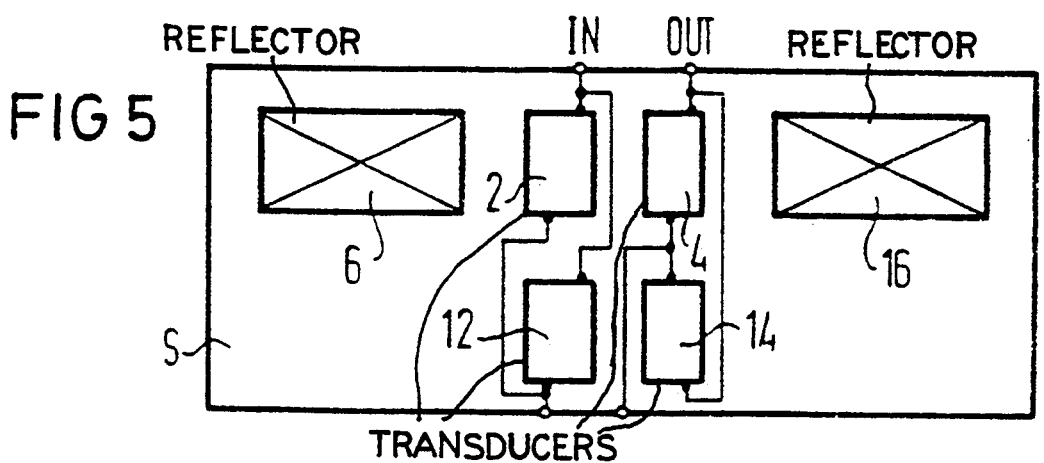
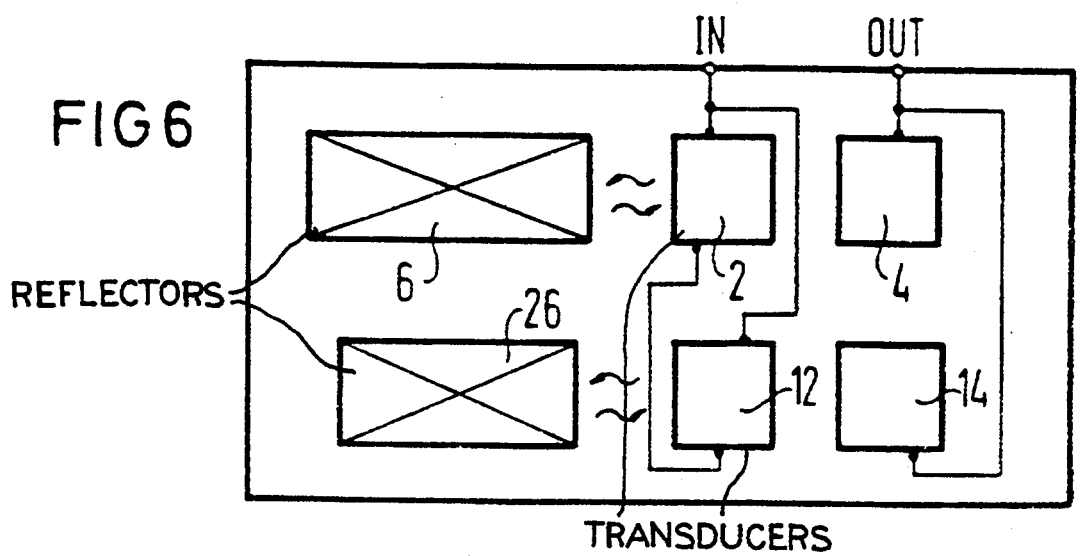

SURFACE ACOUSTIC WAVE REFLECTOR FILTER HAVING TWO NON-RESONANT TRACKS

BACKGROUND OF THE INVENTION

Field of the Invention

The present invention relates to a reflector filter operating with acoustic surface waves, having an input transducer, an output transducer and having a reflector structure. The signal is to proceed from the input transducer to the output transducer on an acoustic path via the reflector structure in order to obtain the required filtering effect. Direct signal transfer between the input transducer and the output transducer is undesired crosstalk, which is to be prevented as fully as possible. Known solutions to this problem are to arrange the input transducer and the output transducer on the substrate of the filter in such a way that the direct acoustic signal transfer from the input to the output is prevented. The opposite is the case with a resonator filter.

Reflector surface wave filters, referred to as RAC filters, are known from the U.S. Pat. Nos. 4,484,160 and 4,520,330. One embodiment comprises an input transducer and an output transducer and two reflector structures which have reflector fingers that are positioned obliquely in such a way that an acoustic wave proceeding into one reflector is deflected by approximately 90° and proceeds into the other reflector and, in turn deflected 90° by the other reflector, is supplied to the output transducer. A filter of this type is suitable as a broadband filter for use in defining a time interval. The finger structures of the aforesaid reflectors can be weighted and/or dispersive in accordance with the desired transmission function. In particular, finger displacement weighting, finger omission weighting and finger rotation can be provided as finger weighting. Such a known reflector filter has two acoustic tracks and an input transducer and an output transducer are located in one of the two tracks in each case. As a result of the folded acoustic path, such a filter requires a smaller length of the substrate, which also incurs substantial savings. The known RAC filter has however a certain disadvantage, in that the angle accuracy of the reflection is temperature-dependent, even in the case of a substrate made of quartz.

Further embodiments of multi-track reflector filters with multi-strip couplers are disclosed in IEEE Trans. Ultrasonics, Vol. 35 (1988), pages 61 ff. The multi-strip coupler requires a substrate with a high electroacoustic coupling factor. However, such substrates are temperature-dependent to a relatively high degree with respect to their wave propagation properties. Moreover, multi-strip couplers are susceptible to losses and also make it more difficult to calculate the behavior of such a filter.

A prior art reference that is only of apparent relevance to the invention to be described below which has surface wave filters having reflectors with 180° reflection arranged in two tracks is known from "Patent Abstracts of Japan", Vol. 10, No. 363 (E-462) (2429), p. 1286. However, an independent filter is realized therein in each of the tracks. One track is a resonator filter that serves as a component of an oscillator and the other track is the output filter for the entire circuit. None of the two surface wave arrangements is a reflector filter as provided by the invention with useful signal transmission of the signal frequency provided only via the reflector.

SUMMARY OF THE INVENTION

The object of the present invention is to provide a reflector filter operating with acoustic surface waves, whose properties, including the reflection, exhibit an optimum temperature independency with the necessary substrate body being of the smallest possible size, in relation to the aforesaid requirements with respect to selectivity, and if appropriate the filter also exhibiting thereby a minimum loss of signal energy (low loss). The filter is to have as low as possible acoustic crosstalk.

This object is achieved with a reflector filter operating with acoustic surface waves which includes a substrate, having an input transducer and having an output transducer, with at least one reflector and with 180° deflection of the surface wave on the path between the input transducer and the output transducer brought about by the reflector or the reflectors, wherein the 180° deflection is brought about by one and the same reflector, two mutually separate main propagation tracks are provided for two mutually separate surface waves, such a respective transducer system having an input transducer and an output transducer is provided for each main propagation track, in which the input transducers on the one hand and the output transducers on the other hand have structures identical to one another, and the electrical terminals of the input transducers on the one hand and those of the output transducers on the other hand are connected to one another in such a way that the signals transmitted in the respective one of the two transducer systems on the direct acoustic path between input transducer and output transducer are present with at least approximate phase opposition in the connected output terminals of the output transducers. Further advantageous embodiments of such a filter provide that the phase difference is achieved by the terminals of the two output transducers of the two transducer systems having opposite polarity. Instead, other embodiments provide that the phase difference is achieved by the terminals of the two input transducers of the two transducer systems having opposite polarity. Another possibility provides that the phase difference is achieved by the input transducer and the output transducer within the transducer systems having mutually opposite phases.

The phase-opposed output signal is achieved by a distance from the input transducer to the output transducer of the transducer systems which differs by an uneven multiple of half the wavelength lambda.

Some embodiments have the track with a first reflector having a further reflector, arranged in-line, on the other side of the transducer system. Alternately, a reflector structure is likewise provided in the second main propagation track.

The two main propagation tracks are located on two mutually separate substrates.

Within the meaning of the invention, "surface acoustic waves" are understood to be acoustic waves that propagate in or near the surface of a solid (substrate), which are more specifically specified as Rayleigh waves, Bleustein waves, SSBW waves (surface skimming bulk waves) and the like, and the occurrence of which in each case is a question of the orientation of the crystal direction of the substrate in relation to the arrangement of the surface acoustic wave structures.

The present invention is based on the idea of producing filters in an in-line arrangement, that is to say with 180° back-reflection in the reflector, and correcting the crosstalk that inevitably occurs thereby as a result of "direct" acoustic signal transfer between the input transducer and the output transducer in a specific manner. The solution of excluding the crosstalk in the result was found in measures for compensation of the crosstalk. A filter according to the invention consists of an in-line reflector filter, which is conceived without regard for the occurrence of the direct acoustic crosstalk and to which a compensation arrangement is assigned. The compensation arrangement may be arranged with the in-line filter on one and the same substrate, so that in principle a two-track design is thus produced. The compensation arrangement can however also be realized on a substrate separate therefrom, since only electrical interaction is required between the actual in-line filter and the compensation arrangement to achieve the object of the invention. Producing the required design is more simple for a filter according to the invention than is the case for an RAC filter.

BRIEF DESCRIPTION OF THE DRAWINGS

FIG. 4 shows a basic diagram of an embodiment with a compensating filter component on a separate substrate, FIG. 5 shows an embodiment with two reflectors in one track, and FIG. 6 shows an embodiment with one reflector each in the two compensation filter components.

DETAILED DESCRIPTION OF THE PREFERRED EMBODIMENTS

Figure 1:
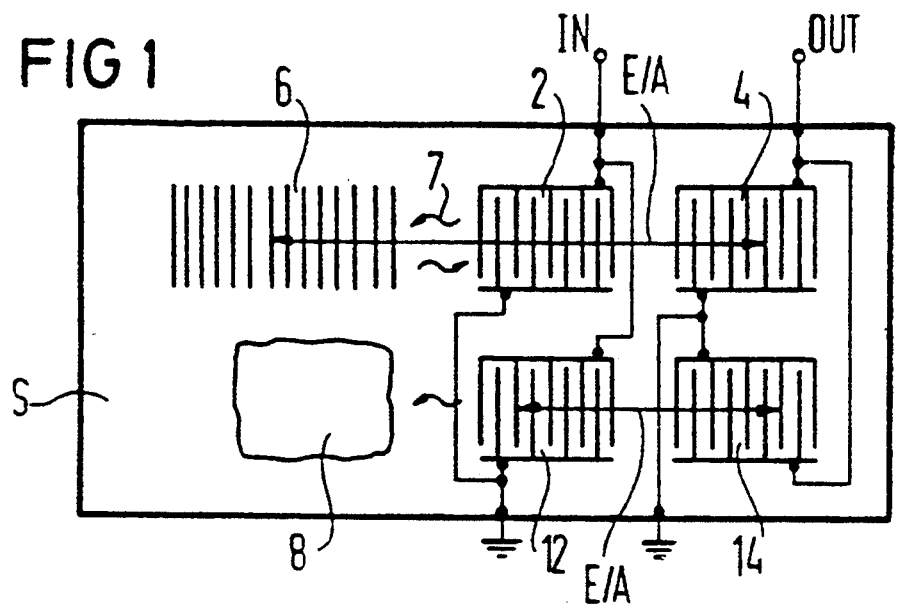
FIG. 1 shows an embodiment of the invention, by reference to which the principles of the invention will also be explained.

In FIG. 1, S indicates the external contour of the substrate of the filter. Reference character 2 denotes an interdigital transducer as an input transducer on the surface of the substrate. Reference character 4 denotes a corresponding output transducer. The input transducer 2 and the output transducer 4 have a coincident main propagation direction E/A of the acoustic wave, which determines the in-line axis. The reflector structure denoted by 6 is present on the axis of the main propagation direction E/A, and 7 denotes the path of the acoustic wave between the input transducer 2 and the reflector 6 on the one hand and the reflector 6 and the output transducer 4 on the other hand, the wave proceeding through the transducer 2 into the transducer 4 in the path between the reflector 6 and the output transducer 4. An input signal can be transmitted through the reflector structure 6 into the output transducer 4 with the filter arrangement comprising the parts 2, 4 and 6, the associated output signal corresponding to the filter characteristic of the reflector structure.

The arrangement described thus far has the disadvantage that there is a substantial direct signal transmission between the input transducer 2 and the output transducer 4, on an acoustic path, that is to say via an acoustic wave. However, this component, termed crosstalk, in the output signal of the output transducer 4 must not occur. In order to achieve this, according to the invention, provision is made to provide a further input transducer 12 and a further output transducer 14, in the exemplary embodiment of FIG. 1 likewise on the substrate S, as the figure shows. In addition, although not absolutely necessary, a surface coating 8 acting as an acoustic sump or absorber is provided on the surface of the substrate S. An acoustic wave proceeding from the transducer 12 into this sump 8 is damped there in such a way that no significant acoustic signal can proceed from there into the output transducer 14. This means that the output transducer 14 only supplies the output signal which proceeds from the input transducer 12 into the output transducer 14 through, as already described above, actually undesired direct acoustic transmission.

According to the invention, it is provided that the input transducers 2 and 12 on the one hand and the output transducers 4 and 14 on the other hand are identically designed transducers in each case. This ensures that the actually undesired, direct acoustic crosstalk leads to crosstalk signals of equal amplitude in the output transducer 4 and in the output transducer 14. It is furthermore provided according to the invention that those measures be taken which lead to the direct. crosstalk between the transducers 2 and 4 of the one transducer system on the one hand and between the transducers 12 and 14 of the other transducer system on the other hand resulting in crosstalk signals of opposite phase at the output terminals of the two transducer systems. If, therefore, the output terminals of these two output transducers 4 and 14 are connected electrically in parallel, according to the invention the signal components resulting from direct acoustic crosstalk compensate one another in the resulting output signal and the output transducer 4 then supplies only the signal transmitted via the reflector structure 6 at the output terminal.

FIG. 1 shows two transducers 2 and 12 which are identical to one another not only in terms of structure but also in terms of their arrangement. The transducers 4 and 14 are likewise identical in terms of structure, but they are connected to one another with opposed phase (given the electrical connection indicated in FIG. 1).

Figure 2:
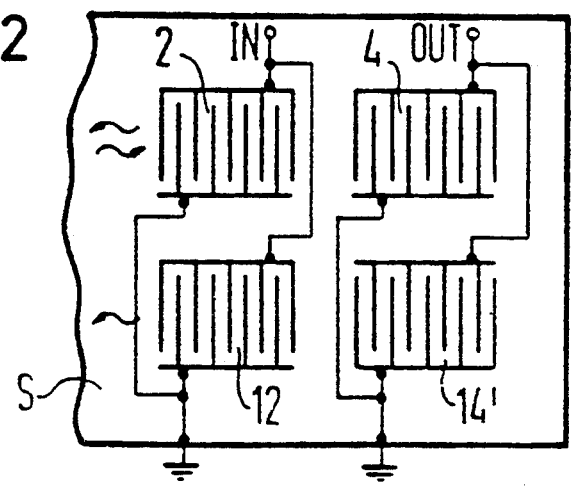
FIG. 2 shows in section a filter with acoustic phase reversal by polarization of the fingers.

The section shown in FIG. 2 represents an "acoustic" reversal of the phase for the transducer 14', namely with the first finger in phase opposition. An acoustic wave proceeding from the transducer 12 to the transducer 14' generates in the transducer 14' an output signal which is in phase opposition to the transmission between the transducers 2 and 4.

Figure 3:
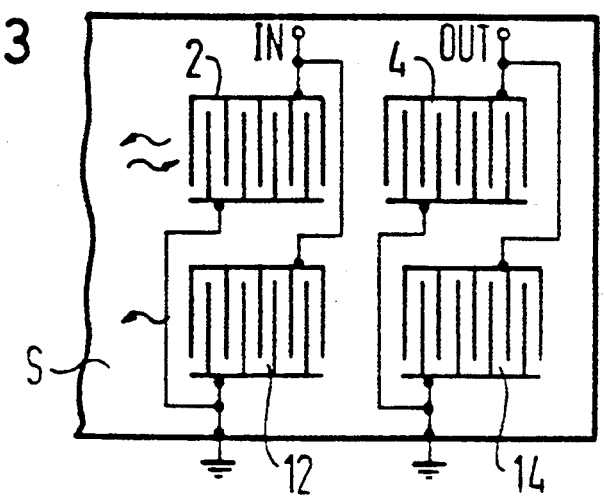
FIG. 3 shows an example of such a phase reversal by means of an altered distance.

A corresponding phase jump can also be achieved, as FIG. 3 shows, namely if the distance between the transducers 2 and 4 on the one hand and the transducers 12 and 14 on the other hand is made to differ by an uneven multiple of lambda/2, to be precise with otherwise identically designed and arranged transducers 4 and 14, as in FIG. 1. This path which is longer by an uneven multiple of half the wavelength likewise leads to an opposite-phase signal in the transducer 14 and hence to compensation of the acoustic crosstalk in accordance with the invention.

FIG. 4 shows a basic diagram of a filter according to the invention, in which the arrangement of the transducers 12 and 14 is located on a substrate S″ which is separate from the substrate S′ of the arrangement having the structures 2, 4 and 6. The phase relationships and the electrical connections must also be maintained for the embodiment according to FIG. 4 in the manner described in order to achieve the result according to the invention of canceling the crosstalk by phase-opposed superimposition.

FIG. 5 shows an arrangement, again only as a basic diagram, with the structures 2, 4, 6, 12 and 14 and additionally with a further reflector structure 16. The crosstalk compensation provided according to the invention is again effected between the structures 2 and 4 on the one hand and 12 and 14 on the other hand. The advantage of an embodiment according to FIG. 5 is that the losses in the track provided with reflectors are minimized because the acoustic waves propagated by the input transducer 2 toward both sides proceed via the reflector structures 6 and 16 into the output transducer 4. However, a filter according to FIG. 5 does require a greater length, namely corresponding to the length of the additional reflector structure 16. In addition, the transducers must be matched in order to avoid resonances.

FIG. 6 shows a further development of the invention. The embodiment of FIG. 6 differs from that of FIG. 1 in that a further reflector structure 26 is provided instead of the acoustic absorber 8. The reflector structures 6 and 26 need not, for example, necessarily be identical structures. If they are selected to be different, it is possible to realize also, for example, disjunctive frequency ranges therewith. Since in this exemplary embodiment according to FIG. 6, according to the invention the transducers 2 and 4 on the one hand and 12 and 14 on the other hand must exhibit identical structure and corresponding arrangement or corresponding connection in accordance with the above rules, with an embodiment according to FIG. 6 it is also possible to achieve the compensation of the direct crosstalk between input transducer and output transducer in accordance with this object of the invention. It should be noted however that the filter signal occurring with reflection in the reflector 26 in the output transducer 14 does not experience cancellation together with the filter signal of the transducer 4 because the phase relationships of the transducers 2/4 on the one hand and of the transducers 12/14 or 12/14' on the other hand are selected according to the invention. For example, the distances between the transducer 2 and the reflector structure 6 on the one hand and the structures 12/26 on the other hand are selected in such a way that receive signals of equal phase occur.

In order to achieve a particularly low-loss filter, the transducers can be designed as unidirectional filters which radiate the acoustic surface wave only in the direction toward the respective associated reflector. Unidirectional transducers known from the prior art may be used for this purpose.

In the above embodiments it is assumed for the transducers 2 and 12 that they are the input transducers. It is also possible to exchange the functions "input transducer" and "output transducer" analogously. The important point is the (equal-strength) signals of the direct acoustic signal transfer occurring in phase opposition to one another which mutually cancel each other out.

Although other modifications and changes may be suggested by those skilled in the art, it is the intention of the inventors to embody within the patent warranted hereon all changes and modifications as reasonably and properly come within the scope of their contribution to the art.

I claim:

1. A surface acoustic wave reflector filter with useful surface acoustic wave transmission effected exclusively by reflection, comprising:

a substrate consisting of a material for propagation for surface acoustic waves;

a first input transducer on said substrate operable to receive an input signal and to emit first surface acoustic waves in response thereto, and a first output transducer on said substrate for receiving said first surface acoustic waves, said first input transducer and said first output transducer defining a first main non-resonant propagation track;

at least one reflector disposed on said substrate for reflecting said first surface acoustic waves in said first main propagation track to cause non-resonant 180° reflection of the first surface acoustic waves on a path between said first input transducer and said first output transducer;

a second input transducer on said substrate operable to receive said input signal and to emit second surface acoustic waves in response thereto, and a second output transducer on said substrate for receiving said second acoustic waves, said second input transducer and said second output transducer defining a second main non-resonant propagation track separate from said first main non-resonant propagation track, said first and second input transducers and said first and second output transducers having identical electrode structures and each having electrical terminals connected to the respective electrode structures; and means for respectively connecting said electrical terminals of said first and second input transducers and for connecting said electrical terminals of said first and second output transducers such that said first surface acoustic waves in said first main non-resonant propagation track propagate with a phase which is substantially opposite to a phase of said second surface acoustic waves propagating in said second main non-resonant propagation track.

2. A surface acoustic wave filter as claimed in claim 1, wherein said means for respectively connecting comprises means for connecting said electrical terminals of said first output transducer to said electrical terminals of said second transducer with opposite polarity.

3. A surface acoustic wave filter as claimed in claim 1, wherein said means for respectively connecting comprises means for connecting said electrical terminals of said first output transducer to said electrical terminals of second input transducer with opposite polarity.

4. A surface acoustic wave filter as claimed in claim 1, further comprising a reflector structure disposed on said substrate in said second main propagation track.

5. A surface acoustic wave filter as claimed in claim 1, wherein said substrate comprises a first substrate and a second substrate, and wherein said first main non-resonant propagation track is on said first substrate and said second main non-resonant propagation track is on said second substrate.

6. A surface acoustic wave filter as claimed in claim 1, wherein said first main non-resonant propagation track has a further reflector, arranged in-line on said substrate, on a side of said first and second transducers opposite a side from said at least one reflector.

7. A surface acoustic wave reflector filter with useful surface acoustic wave transmission effected exclusively by reflection, comprising:

a substrate consisting of a material for propagation for surface acoustic waves;

a first input transducer on said substrate operable to receive an input signal and to emit first surface acoustic waves in response thereto, and a first output transducer on said substrate for receiving said first surface acoustic waves, said first input transducer and said first output transducer defining a first main non-resonant propagation track;

at least one reflector disposed on said substrate for reflecting said first surface acoustic waves in said first main propagation track to cause non-resonant 180° reflection of the first surface acoustic waves on a path between said first input transducer and said first output transducer;

a second input transducer on said substrate operable to receive said input signal and to emit second surface acoustic waves in response thereto, and a second output transducer on said substrate for receiving said second acoustic waves, said second input transducer and said second output transducer defining a second main non-resonant propagation track separate from said first main non-resonant propagation track;

three of said first and second input transducers and said first and second output transducers having identical electrode structures, and a remaining one of said first and second input transducers and said first and second output transducers having an electrode structure which is oriented asymmetrical relative to said identical electrode structures for causing said first surface acoustic waves in said first main non-resonant propagation track to propagate with a phase which is substantially opposite to a phase of said second surface acoustic waves propagating in said second main non-resonant propagation track.

8. A surface acoustic wave reflector filter with useful surface acoustic wave transmission effected exclusively by reflection, comprising:

a substrate consisting of a material for propagation for surface acoustic waves;

a first input transducer on said substrate operable to receive an input signal and to emit first surface acoustic waves in response thereto, and a first output transducer on said substrate for receiving said first surface acoustic waves, said first input transducer and said first output transducer defining a first main non-resonant propagation track;

at least one reflector disposed on said substrate for reflecting said first surface acoustic waves in said first main propagation track to cause non-resonant 180° reflection of the first surface acoustic waves on a path between said first input transducer and said first output transducer;

a second input transducer on said substrate operable to receive said input signal and to emit second surface acoustic waves in response thereto, and a second output transducer on said substrate for receiving said second acoustic waves, said second input transducer and said second output transducer defining a second main non-resonant propagation track separate from said first main non-resonant propagation track;

said first surface acoustic waves having a wavelength and said second surface acoustic waves having a wavelength which is the same as the wavelength of said first surface acoustic waves;

said first and second input transducers and said first and second output transducers having identical electrode structures; and said first input transducer being spaced on said substrate a first distance from said first output transducer, said second input transducer being spaced on said substrate a second distance from said second output transducer, said first and second distances differing by an uneven multiple of half of said same wavelength so that said first surface acoustic waves in said first main non-resonant propagation track propagate with a phase which is substantially opposite to a phase of said second surface acoustic waves propagating in said second main non-resonant propagation track.

* * * * *